United States Patent [19]

Haney

[11] 3,999,124

[45] Dec. 21, 1976

[54] REFERENCE QUANTITY AND UNKNOWN QUANTITY COMPARATOR

[75] Inventor: Jerry D. Haney, Sunnyvale, Calif.

[73] Assignee: Romilly John Simms, Menlo Park, Calif.

[22] Filed: Mar. 24, 1975

[21] Appl. No.: 561,601

[52] U.S. Cl. .......................... 324/99 D; 340/248 A
[51] Int. Cl.² .................. G01R 17/06; G08B 21/00
[58] Field of Search ............... 324/99 D, 133, 111; 340/248 A, 248 B, 248 C, 253 N, 239 R

[56] References Cited
UNITED STATES PATENTS

3,617,885  11/1971  Wheable .......................... 324/99 D

Primary Examiner—R. V. Rolinec
Assistant Examiner—Ernest F. Karlsen
Attorney, Agent, or Firm—Lowhurst & Aine

[57] ABSTRACT

A method of and apparatus for determining when an unknown quantity is within a desired range of a reference quantity. The apparatus includes a dual slope integrator which integrates the reference quantity and the unknown quantity and discharges the resultant integrated levels. By integrating the reference quantity at least once and the unknown quantity at least twice for three different time periods which differ from one another by amounts which are proportional to the desired range, a comparison of the discharge times of the resultant integrated levels will provide an indication of whether the unknown quantity is within the desired range, when the desired range is a percentage of the value of the reference quantity. By integrating the reference quantity at least once and the unknown quantity at least twice for the same time period and then discharging each of the resultant integrated levels for three different time periods which differ from one another by amounts which are proportional to the desired range, a comparison of the times to further discharge to a preselected level will provide an indication of whether the unknown quantity is within the desired range, when the desired range is a percentage of full scale.

26 Claims, 5 Drawing Figures

Fig_1

REFERENCE QUANTITY AND UNKNOWN QUANTITY COMPARATOR

BACKGROUND OF THE INVENTION

1. Field of the Invention

This invention relates generally to an apparatus for and method of measuring an unknown quantity, and more particularly to an apparatus for and method of determining when the value of an unknown quantity is within a desired range of a reference quantity.

2. Prior Art

It is often desirable to determine when the value of an unknown quantity is within a desired range of a reference quantity. For example, many processes employ chemical agents which must be conveyed at prescribed flow rates from one station to another, and it is often necessary to maintain those flow rates within a prescribed range. In such a case, the reference quantity is the desired flow rate of a particular chemical agent and the desired range is either a percentage of that flow rate or an arbitrary amount, such as a prescribed number of units. Accordingly, in this example, the value of the reference quantity, and the desired range with respect to that reference quantity are known.

In some instances, however, the value of the reference quantity is not known. For example, when it is desired to compare some characteristic of one material, such as a standard or a reference, with the same characteristic of another material to determine whether the quantitized values of such characteristics are within a prescribed range of one another, the quantitized value of the examined characteristic of the reference material is not known. This is the case when, for example, light reflectance from one material is to be compared with the light reflectance from another material.

In the past, this function was often performed mentally by an operator observing a meter connected to an instrument for measuring the unknown quantity and comparing the meter reading with the value of the reference quantity. If the reference quantity is unknown, such as in the second example described above, another meter connected to a second instrument for measuring the reference quantity is observed by an operator and that meter reading is compared with the measured value of the unknown quantity.

It can be appreciated that this method of determining when an unknown quantity is within a desired range of a reference quantity is subject to errors. Since the comparison requires visual inspection by an operator, the unknown quantity may vary outside the desired range without detection. Furthermore, errors can occur in any visual interpretation and analysis of data in performing such a comparison. Visual interpretation and analysis of data are also time consuming functions, not only increasing labor costs, but delaying the acquisition of the results of the comparison.

In order to overcome the problems associated with an operator observing instrument readings and visually interpreting and analyzing such readings, attempts have been made to automatically sense the reference quantity and the unknown quantity and to automatically compare one with the other to provide an indication, such as an alarm, whenever the unknown quantity varies outside a prescribed range with respect to the reference quantity. One such attempt involves storing a voltage corresponding to the value of the sensed reference quantity, and comparing the stored value with a voltage corresponding to the sample unknown quantity. The comparison is performed by reducing both voltages by a prescribed amount which corresponds to the desired range, and comparing the full value of each voltage with the reduced value of each voltage in two comparators.

This analog technique for determining when an unknown quantity is within a desired range of a reference quantity requires constant adjustment due to drift of the components and calibration of the range settings. If it is desired to maintain a range having arbitrary limits, such as plus and minus a prescribed number of units (percent of full scale, rather than percent of readings), the operator of the above described apparatus would have to calculate those arbitrary limits as percentages of the reference. However, since the value of the reference quantity is unknown, such calculation can not be performed without additional instruments to measure the reference quantity. Such human involvement in reading meters and calculating the range limits would, of course, present the same problems which are mentioned above.

Other analog techniques are also empoyed for performing one or more of the above described functions. However, these techiques also suffer from the same problems discussed above. Usually, such techniques are only capable of providing a range which is a percentage of full scale (arbitrary limits) or a percentage of reading. If it is desired to determine when the unknown quantity is within a range which is a percentage of reading and the circuit can only be set to provide a range as a percentage of full scale, calculations are required to convert from one to the other. Since the reference quantity may change from time to time, it would be necessary to recalculate the range for each new reference quantity.

Another problem occurs in the storage of the reference quantity. If a voltage corresponding to the value of the reference quantity is stored on a capacitor, for example, that voltage will begin to decay as it is being compared with the voltage corresponding to the sampled quantity. Accordingly, if the reference quantity remains fixed over a relatively long time period, the stored voltage corresponding thereto must be periodically replenished.

Accordingly, it can be appreciated that a need exists for an apparatus which is capable of storing a quantity corresponding to a reference quantity for an indefinite period of time and comparing that stored quantity with a sampled quantity to determine whether the sampled quantity is within a desired range of the reference. Furthermore, a need exists for such an apparatus which does not require visual interpretation and analysis of data in order to perform that comparison. It is also desirable that such an apparatus be capable of establishing a range which is either a percentage of full scale or a percentage of reading.

SUMMARY OF THE INVENTION

Accordingly, it is an object of the present invention to provide an apparatus for and method of determining when the value of an unknown quantity is within a desired range of a reference quantity.

Another object of the present invention is to provide such apparatus and method which do not require interpretation and analysis of data.

Still another object of the present invention is to provide an apparatus for determining when the value of an unknown quantity is within a desired range of a reference quantity, which apparatus does not require calibration of range settings and is not subject to drift of its components.

A further object of the present invention is to provide an apparatus for determining when the value of an unknown quantity is within a desired range of a reference quantity, which range can be selected to be either a percentage of reading or a percentage of full scale.

Still a further object of the present invention is to provide an apparatus for determining when the value of an unknown quantity is within a desired range of a reference quantity, which apparatus is capable of storing a quantity proportional to the value of the reference quantity for an indefinite period of time for comparison with the unknown quantity.

These and other objects of the present invention are attained by first storing a quantity which is proportional to the value of the reference quantity, integrating the unknown quantity at least twice, discharging the integrated levels to a preselected level, and comparing at least a portion of the discharging times with the stored quantity. Generally, the reference quantity and the unknown quantity can be sensed by any transducer or sensor which provides an electrical signal having an amplitude which varies in direct proportion to the value of the sensed quantity.

In a percent-of-reading mode, the signal corresponding to the unknown quantity is integrated twice for two different time periods, with the difference between such time periods being related to one of the time periods as the desired range is related to one of the limits of the desired range. At the end of those time periods, the resultant integrated levels are discharged at a fixed rate to a preselected level and the time required to discharge is measured. If the stored quantity which is proportional to the reference quantity is between the measured time quantities, the unknown is within the desired range; otherwise it is not.

In a percent-of-full scale mode, the signal corresponding to the unknown quantity is integrated twice for the same time period and the resultant integrated levels are each discharged at a fixed rate to a preselected value. Two preselected time periods which differ by an amount proportional to the desired range are subtracted from the time required to discharge from the integrated levels and the remaining time periods are measured. If the stored quantity which is proportional to the reference quantity is between the measured time periods, the unknown is within the desired range; otherwise it is not. In both modes, the stored quantity can be obtained by integrating and discharging the reference quantity in a cycle similar to one of the cycles for determining the unknown quantity.

A feature of the present invention resides in the provision of means for measuring the reference signal quantity and separate means for storing the reference quantity which can be either preset therein or supplied thereto from the measuring means.

Another feature of the present invention resides in the provision of means which can be actuated to provide a range which is either a percentage of reading or a percentage of full scale.

These and other objects, features and advantages of the present invention, however, will be more fully realized and understood from the following detailed description, when taken in conjunction with the accompanying drawings, wherein:

DETAILED DESCRIPTION OF THE PREFERRED EMBODIMENTS

Figure 1:
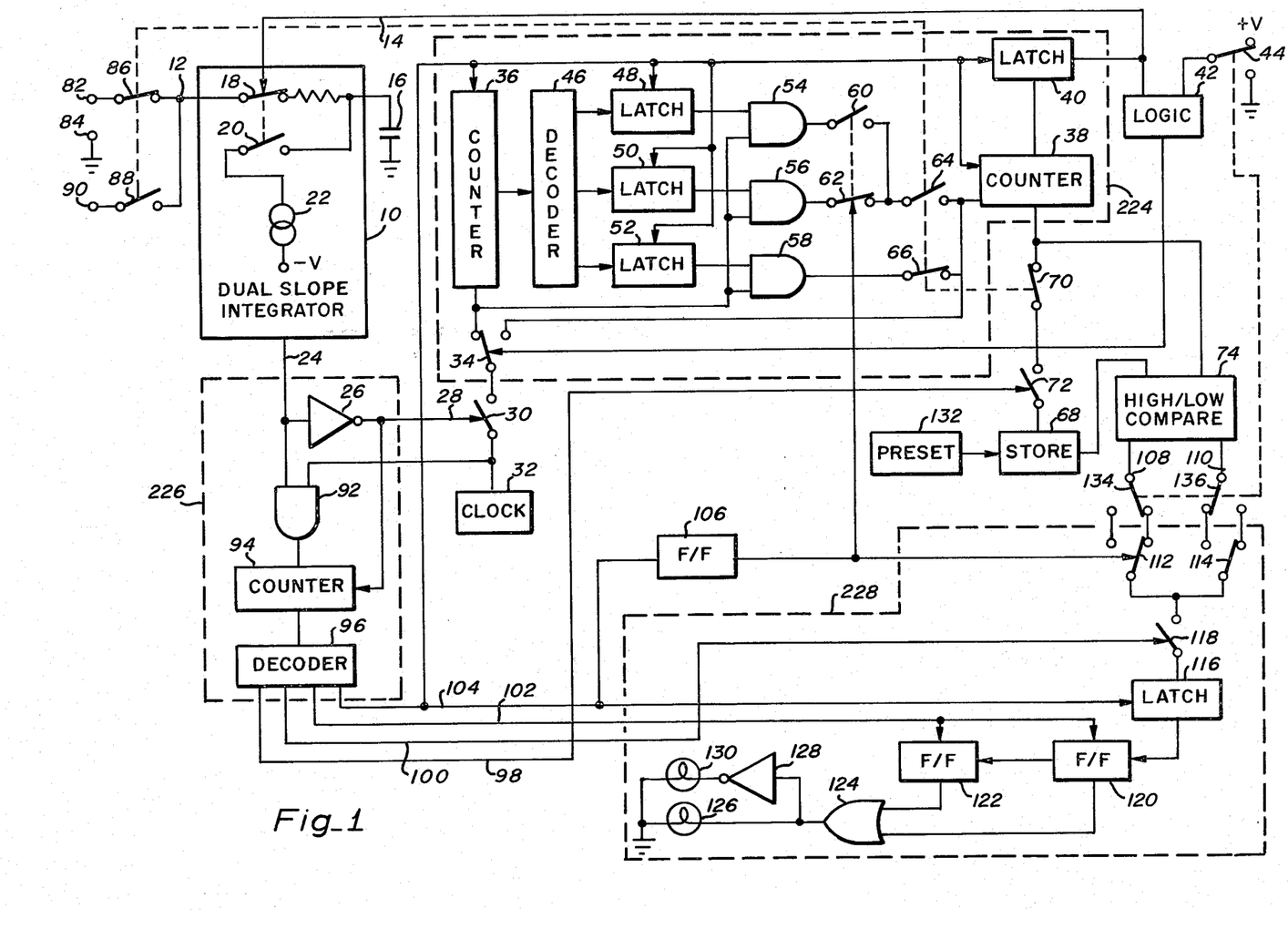
FIG. 1 is a diagrammatic block and logic illustration of an apparatus constructed in accordance with the principles of the present invention for determining when an unknown quantity is within a desired range of a reference quantity.

With reference to FIG. 1, there is shown an apparatus which is constructed in accordance with the principles of the present invention for determining when an unknown quantity is within a desired range of a reference quantity. Generally, the apparatus of the present invention makes this determination by converting the analog signals corresponding to the reference quantity and the unknown quantity into digital signals or counts which are then compared with one another. During the percent-of-reading mode, the analog signals corresponding to the reference quantity and the unknown quantity are integrated for preselected time periods, with the integrating time period for the unknown quantity being effectively increased by a preselected time increment over the integration time for the reference quantity for one cycle and decreased by a preselected time increment over the integration time for the reference quantity during a subsequent cycle. These preselected time increments are proportional to the desired range.

When the respective time periods required to discharge from the resultant integrated levels are compared, a determination can be readily made as to whether the unknown quantity is within the desired range of the reference quantity. That is, if the time period required to discharge from the integrated level corresponding to the reference quantity is between the time periods required to discharge from the integrated levels corresponding to the unknown quantity, then the unknown quantity is within the desired range of the reference quantity.

During the percent-of-full scale mode of operation, the times to integrate the analog signals corresponding to the reference quantity and the unknown quantity are made equal to one another. However, the time to discharge the unknown quantity is effectively increased and decreased in subsequent cycles by a preselected increment of time which is proportional to the desired range. A similar comparison is made as in the percent-of-reading mode of the resultant altered times required to discharge to determine whether the unknown quantity is within the desired range.

Another way of considering the method performed by the apparatus of the present invention is that the analog signals corresponding to the reference quantity and the unknown quantity are integrated in one direction to obtain respective integrated levels and a known quantity is integrated in an opposite direction from those integrated levels to a preselected level, with such integrations being performed with different integration scales. That is, by changing either the integration scale of the integration of the reference and unknown quantities or the integration of the known quantity, a comparison of the absolute times required to integrate the known quantity will provide an indication of whether the unknown quantity is within the desired range, if the absolute difference in the respective scales employed is equal to the desired range.

With reference to FIG. 1 in detail, there is shown a dual slope integrator 10, typical of which is a commercially available unit from Motorola Semiconducter Products, Inc., and designated as a dual slope A-to-D converter, Model No. MC1505. The dual slope integrator 10 integrates an electrical signal supplied to an input 12 thereof for a predetermined time period as determined by a signal on a line 14. The amplitude of the resultant integrated level is determined by the value of a capacitor 16 connected thereto and the charge developed on the capacitor 16 is equal to that integrated level. When the signal on the line 14 changes states, the voltage developed on the capacitor 16 is discharged at a fixed rate.

The dual slope integrator 10 is illustrated diagrammatically as including a pair of switches 18 and 20 which are ganged together and are controlled by the signal on the line 14. When an analog electrical signal is supplied to the terminal 12, it charges the capacitor 16 through the normally closed switch 18 for preselected time period as determined by the signal on the line 14. At the end of that preselected time period, the switch 18 opens and the switch 20 closes to connect the capacitor 16 through a constant current source 22 to a source of negative potential. Accordingly, the charge on the capacitor 16 is discharged at a fixed rate.

The discharge of the capacitor 16 may also be considered as the integration of a voltage having a known and fixed amplitude and which is of opposite polarity to the polarity of the analog signal supplied to the input 12. Since the capacitor 16 is connected to a source of negative potential, the discharge will continue until a negative potential is developed thereon and the switches 18 and 20 are returned to their normal positions by the signal on the line 14. Whenever a negative potential exists on the capacitor 16 a high output level will be provided on a line 24 from the integrator 10. Accordingly, the leading and trailing edges of the pulse developed on the line 24 will occur at the zero crossings of the discharge slopes and integration slopes, respectively.

Figure 2:
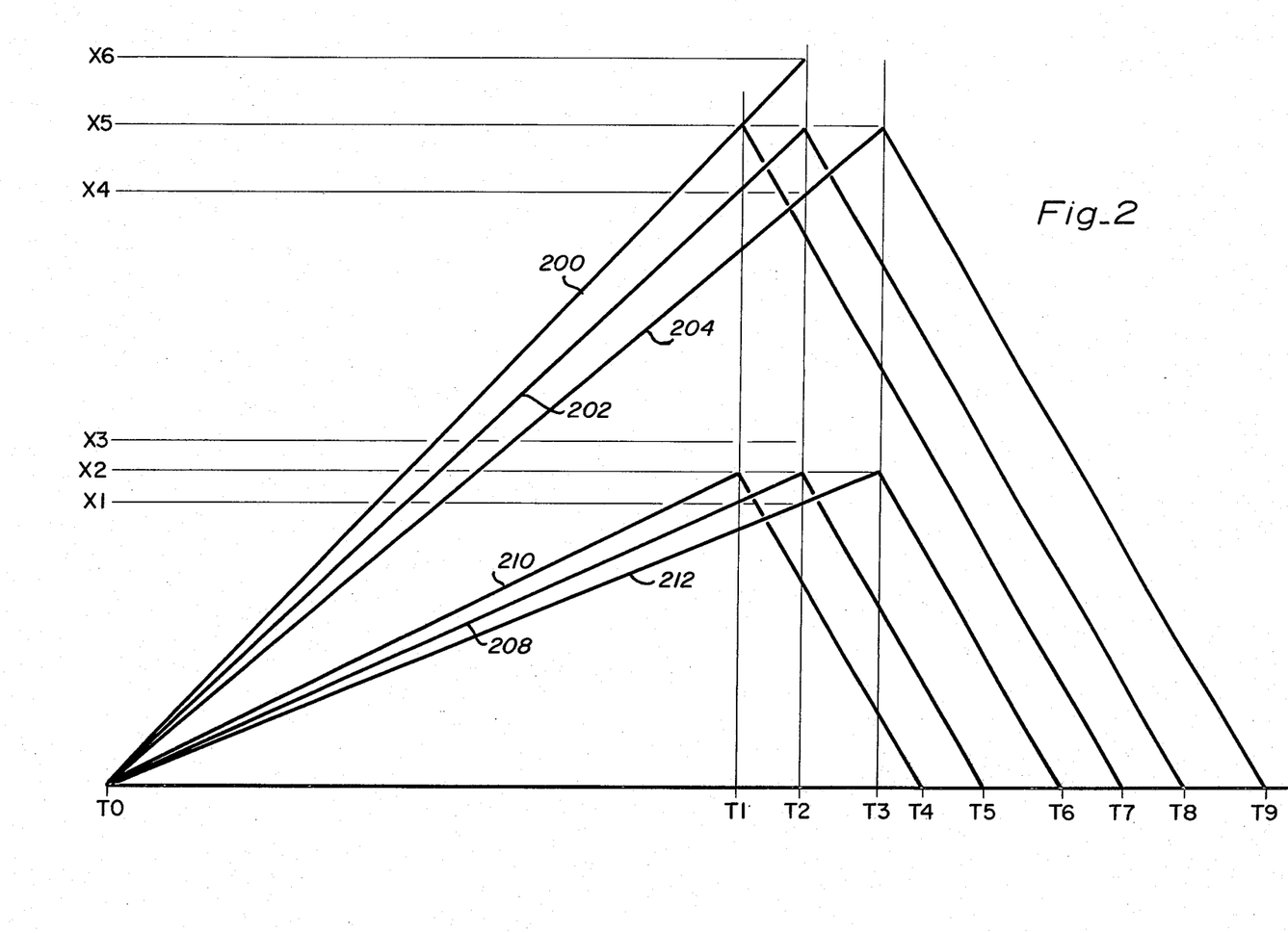
FIG. 2 is a graphical representation of the integration of a reference quantity and quantities corresponding to upper and lower limits of a desired range, and the subsequent discharge of the resultant levels obtained by such integration in a percent-of-reading mode of operation of the apparatus illustrated in FIG. 1.

With the function of the dual slope integrator 10 in mind, and before proceeding further with the discussion of FIG. 1, reference is made to FIGS. 2–5 for an understanding of the intended operation of the apparatus illustrated in FIG. 1 and an understanding of the method of the present invention. With reference to FIG. 2 in detail, there is shown a plurality of lines which are designated with the reference numerals 200, 202 and 204, each corresponding to and representing the charge developed on the capacitor 16 when an appropriate voltage is supplied to the terminal 12. The slope of each of the lines 200, 202 and 204 is directly proportional to the value of the applied voltage. Assume, for example, that the line 202 represents the integration of a voltage corresponding to a reference quantity and that the lines 200 and 204 represent the integration of voltages which correspond to the upper and lower limits, respectively, of a desired range within which it is desired to determine whether or not an unknown quantity exists. Accordingly, X6 is related to the upper limit as X5 is related to the reference quantity and as X4 is related to the lower limit. The desired range, therefore, is directly proportional to X6 minus X4 or X6 minus X5 plus X5 minus X4.

If, in the above example, the voltages corresponding to the reference quantity and the upper and lower limits are all integrated to level X5, such that the resultant integrated levels are equal to one another, the integration time for each of those voltages will be different. That is, the integration time for the upper limit will be equal to T1; the integration time for the reference quantity will be T2; and the integration time for the lower limit will be T3. If each of those integration levels is discharged at a fixed rate and to a preselected value, the discharge times will be equal to one another. As shown in FIG. 2, T7 minus T1 is equal to T8 minus T2 which is equal to T9 minus T3.

If an unknown quantity is integrated for a time T1 and its integration slope is between the integration slopes of the lines 200 and 204, the discharge of the resultant integrated level which is achieved at time T1 at a fixed rate and to the preselected level will be less than T8 minus T2. If that same unknown quantity is integrated for a time T3 and the resultant integrated level achieved at time T3 is discharged at the same fixed rate and to the same preselected level, the discharge time will be greater than T8 minus T2.

However, if an unknown quantity is integrated first for time T1 and again for time T3 and its integration slope is greater then the slope of line 200, the discharge of the resultant integrated levels at times T1 and T3 will both be greater than T8 minus T2. Also, if an unknown quantity is integrated first for time T1 and again for time T3 and its integration slope is less than the slope of line 204, the discharge of the resultant integrated levels at times T1 and T3 will both be less than T8 minus T2. It can be appreciated, therefore, that if the discharge time periods of an integrated unknown quantity are compared with the discharge time of an integrated reference quantity, a determination can be made of whether or not the unknown quantity is within the desired range of the reference quantity.

Figures 3, 4:
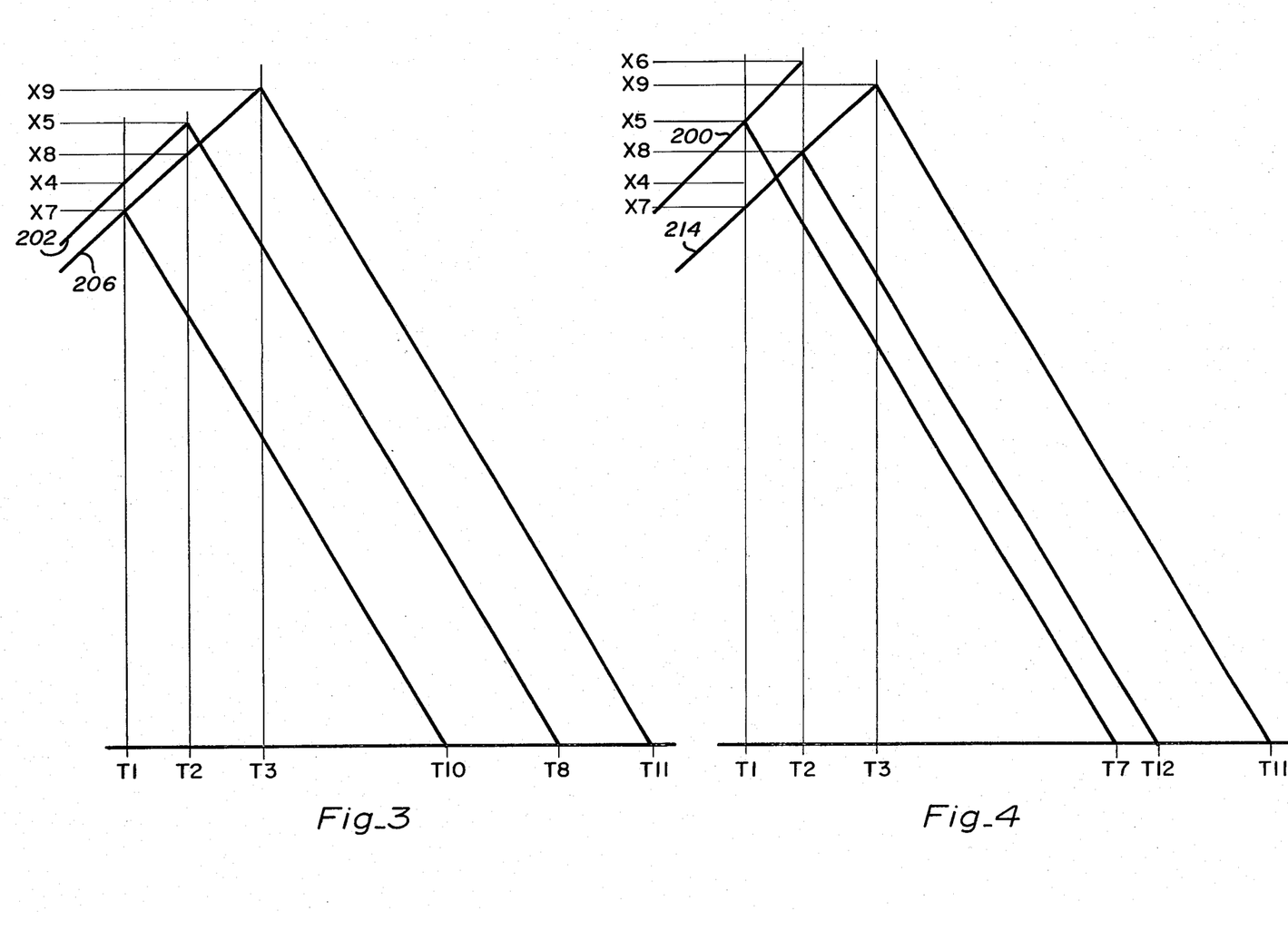
FIGS. 3 and 4 are graphical representations of the integration of a reference quantity and an unknown quantity and the subsequent discharge of the resultant levels obtained during such integration in the percentage-of-reading mode of operation of the apparatus illustrated in FIG. 1.

More particularly, if the discharge time of an integrated reference quantity integrated for time period T2 is between the discharge time periods of an integrated unknown quantity integrated for time periods T1 and T3, then the unknown quantity is within the desired range of the reference quantity; otherwise it is not. FIG. 3 is a graphical representation of the integration of a reference quantity and an unknown quantity and the subsequent discharge of the resultant levels which are obtained during such integration. As shown therein, the line 202 corresponds to the integration of a reference quantity and a line 206 corresponds to the integration of an unknown quantity. If the desired limits of the unknown quantity correspond to the limits illustrated in FIG. 2, then the unknown quantity will be integrated first for the time period T1 and then for the time period T3. As in FIG. 2, the reference quantity will be integrated for the time period T2. When the unknown quantity is integrated for the time period T1 and the resultant integrated level achieved at time T1 is discharged, the discharge time will be equal to T10 − T1. Also, when the unknown quantity is integrated for time T3 and the resultant integrated level achieved at time T3 is discharged, the discharge time will be equal to T11 − T3. Since T10 − T1 is less than T8 − T2 and since T11 − T3 is greater than T8 − T2, the unknown quantity is within the desired range.

The method illustrated in FIGS. 2 and 3 provides a range which is a percent-of-reading as will be better understood from the following. From inspection of FIG. 2, it can be appreciated that, $$\frac{X6 - X5}{X5} = \frac{T2 - T1}{T1}, \quad (1)$$

$$\frac{X5 - X4}{X5} = \frac{T3 - T2}{T3}. \quad (2)$$

By adding expression (1) and (2) together, $$\frac{X6 - X4}{X5} = \frac{T2}{T1} - \frac{T2}{T3}. \quad (3)$$

Since X6−X4 is related to the desired range as X5 is related to the amplitude of the reference quantity, and since the time periods T1, T2 and T3 are fixed, the range which is obtained by establishing the time periods T1, T2 and T3 is a percentage of the magnitude of the reference quantity. Accordingly, the time periods T2−T1 and T3−T2 correspond to a percent of the reference quantity. This relationship can be appreciated from the graphical representation in FIG. 2 in which a line 208 corresponds to the integration of a reference quantity and lines 210 and 212 correspond to the integration of the upper and lower limits of a desired range. From inspection, it can be appreciated that if an unknown quantity is integrated and has a slope which is either greater than the slope of the line 210 or less than the slope of the line 212, the resultant discharge times of that quantity will not satisfy the above requirements for determining that it is within the desired range. More particularly, the time periods T4−T1, T5−T2, and T6−T3 are equal to one another. Accordingly, the unknown quantity must be within the range of X3−X1 if it is to satisfy the above requirements of being within the desired range. It can be appreciated from inspection of FIG. 2 that X3−X1 is related to X2 as X6−X4 is related to X5. Accordingly, the desired range which is established by T3−T1 in relation to T2 provides a range, such as X6−X4 or X3−X1, which is a percentage of the magnitude of the reference quantity, X5 or X2, respectively.

In the above description of FIGS. 2 and 3, it has been assumed that the desired range encompasses the reference quantity. However, it can be appreciated from FIG. 2 that the desired range may not encompass the reference quantity and its limits may both be either less than or greater than the reference quantity. For example, the line 200 may represent the integration of the reference quantity and the lines 202 and 204 may represent the integration of the upper limit and lower limit, respectively, of the desired range. Also, the line 204 may represent the integration of the reference quantity and the lines 200 and 202 may represent the integration of the upper limit and lower limit, respectively, of the desired range. It can also be appreciated that the line 200 may represent the integration of the reference quantity and the lines 200 and 204 may represent the integration of the upper limit and lower limit, respectively, of the desired range. In this latter example, the reference quantity and the upper limit of the desired range are the same.

FIG. 4 graphically illustrates the example in which the line 200 represents the integration of the reference quantity and the unknown quantity is within a desired range, the integration of its upper and lower limits being represented by the lines 202 and 204, respectively, in FIG. 2. The integration of such an unknown quantity is represented by the line 214 in FIG. 4. The reference quantity, therefore, is integrated for time period T1 and the unknown quantity is integrated for time period T2 and then for time period T3. If the resultant integrated levels are discharged, the time period T12−T2 will be less than the time period T7−T1 and the time period T11−T3 will be greater than the time period T7−T1. This relationship of the time periods can be appreciated from inspection of FIG. 4, since X8 is less than X5 and X9 is greater than X5. Accordingly, in the example illustrated in FIG. 4, the discharge time of the reference quantity will be between the discharge times of the unknown quantity.

Figure 5:
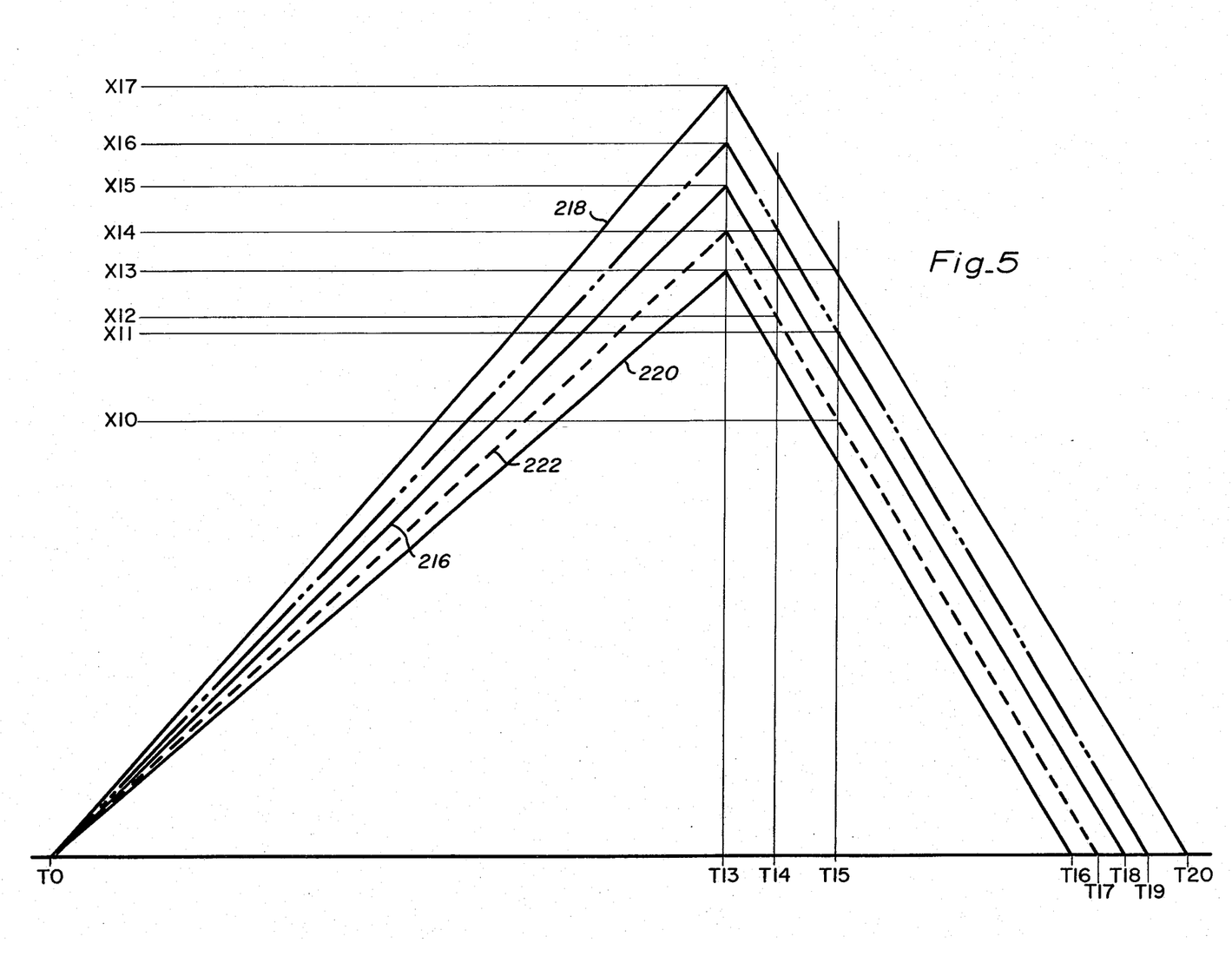
FIG. 5 is a graphical representation similar to those of FIGS. 2, 3 and 4, but in the percentage-of-full scale mode of operation of the apparatus illustrated in FIG. 1.

The apparatus illustrated in FIG. 1 is also capable of providing a range which is a percentage of full scale. The percentage of full scale method in accordance with the present invention is illustrated graphically in FIG. 5. With reference to FIG. 5 in detail, a line 216 represents the integration of a reference quantity and lines 218 and 220 represent the integration of the upper and lower limits, respectively, of the desired range. When the integrated level X15 corresponding to the integration of the reference quantity for a time period T13 is discharged at a fixed rate, its discharge time will be the time period T18−T13. By subtracting a time period T14−T13 from that discharge time, the resultant time period will be T18−T14. When the integration level X13 corresponding to the integration of the lower limit of the desired range is discharged at the same fixed rate, its discharge time will be equal to the time period T16−T13. If the integrated level X17 corresponding to the integration of the upper limit of the desired range for the time period T13 is discharged at the same fixed rate, its integration time will be equal to the time period T20−T13. If the time period T15−T13 is subtracted from that discharge time, the resultant time period will be equal to T20−T15.

It can be appreciated from FIG. 5 that the time periods T20−T15, T18−T14, and T16−T13 are all equal to one and other. If the integration of an unknown quantity has a slope which is less than the slope of the line 218 and greater than the slope of the line 220, the discharge of the resultant integrated level which is attained at time T13 will be equal in time to a time period which is greater than time period T16−T13. However, if the time period T15−T13 is subtracted therefrom, the resultant time period will be less than the time period T18−T14. Accordingly, the percent-of-full scale method of the present invention first integrates the reference quantity for a time period T13 to obtain an integrated level X15 which is then discharged at a fixed rate for the time period T18–T13. During the discharge of the integrated level X15, however, the time period T14–T13 is subtracted from the discharge time and the resultant time period T18–T14 is stored. Thereafter, the unknown quantity is integrated for the time period T13. One example of the integration of an unknown quantity is represented by the dotted line designated with the reference numeral 222 in FIG. 5. Accordingly, the integration of such an unknown quantity for the time period T13 will provide an integrated level equal to X14. The discharge of the integrated level X14 will occur over a time period T17–T13. This time period is greater than the time period T18–T14. If the same unknown quantity is integrated for the time period T13 again, and the resultant integrated level X14 is again discharged at the same fixed rate, the discharge time will again be equal to T17–T13. If the time period T15–T13 is subtracted therefrom the resultant time period T17–T15 will be less than the time period T18–T14. Accordingly, if the discharge time T18–T14 is between the discharge times T17–T13 and T17–T15, the unknown quantity is within the desired range; otherwise it is not.

Assuming, for example, that the integration of the unknown quantity has a slope which is less than the slope of the line 220, the discharge time of the resultant integrated level achieved at time T13 and beginning at time T13 will be less than the time period T18–T14. The discharge of the resultant integrated level corresponding to the unknown quantity at time T13, but beginning at time T15, will also be less than the time period T18–T14. Accordingly, if the discharge times of the resultant integrated levels corresponding to the unknown quantity beginning at time periods T13 and T15 are both less than the time period T18–T14, then the unknown quantity is outside the desired range. The unknown quantity is also outside the desired range if the discharge times beginning at time T13 and time T15 are greater than the time period T18–T14. Such a condition exists when the integration of the unknown quantity has a slope which is greater than the slope of the line 218.

As in the percent-of-reading method, the time periods T15–T14 and T14–T13 establish the desired range. In the percent-of-full scale method, however, the desired range is a percentage of full scale, since once the time periods T15–T14 and T14–T13 are established, a change in the magnitude of the reference quantity will not produce a change in the desired range.

This relationship can be better understood from the following. From inspection of FIG. 5, it can be appreciated that, $$\frac{X17 - X15}{T15 - T14} = \frac{X15 - X13}{T14 - T13} = \frac{X15}{T18 - T13}, \quad (4)$$

where X17–X15 corresponds to the difference between the upper limit of the desired range and the reference quantity, X15–X13 corresponds to the difference between the reference quantity and the lower limit of the desired range, and X15 corresponds to the reference quantity. Since the slope of the discharge of any resultant integrated level is constant, the time period T18–T13 will vary in direct proportion to any change in X15. Accordingly, the quantity on the right hand side of expression (4) will be constant with changes in the reference quantity. Since the time periods T15–T14 and T14–T13 remain fixed (preselected), the difference between the upper and lower limits of the desired range remains constant with changes in the reference quantity.

As in the percent-of-reading method, the integration of the reference quantity may be represented by the line 218 and the integration of the upper and lower limits may be represented by the lines 216 and 220. Also, the integration of the reference quantity may be represented by the line 220 and the integration of the upper and lower limits of the desired range may be represented by the lines 218 and 216, respectively. Furthermore, the reference quantity may be equal to either the upper limit or the lower limit of the desired range.

The method depicted in FIGS. 2–4 integrates the reference quantity at least once and the unknown quantity at least twice over three respective and different time periods, whereas the method depicted in FIG. 5 integrates the reference quantity and the unknown quantity for the same time period. Also, the method shown in FIGS. 2–4 discharges the resultant integrated levels to a preselected level to determine the total discharge times, whereas the method shown in FIG. 5 discharges each resultant integrated level for one of two first discharge times (one of which may be equal to zero) and then measures the further discharge to a preselected level. It will be noted that the resultant integrated levels of the reference quantity and the upper and lower limits of the desired range in the method shown in FIGS. 2–4 are equal to one another, and that the first discharge levels of the reference quantity and the upper and lower limits of the desired range in the method shown in FIG. 5 are equal to one another.

For a better understanding of the method depicted in FIGS. 2–4, it will be assumed that a range of plus and minus one percent of a reference quantity is desired as the acceptable range of the unknown quantity. Since the upper limit (X6) of the desired range is related to the reference quantity (X5) as the time T2 is related to the time T1, the ratio of the time period T2 to the time period T1 will be equal to 1.01 in this example. Accordingly, if the time period T1 is 4000 time units, for example, the time period T2 will be 4040 time units. Also, since the lower limit (X4) of the desired range is related to the reference quantity (X5) as the time T2 is related to the time T3, the ratio of the time period T2 to the time period T3 will be equal to 0.99. Accordingly, if the time period T1 is 4000 time units, the time period T2 will be 4040 time units and the time period T3 will be approximately 4081 time units.

If one is desirous of determining whether an unknown quantity is within a desired range of a reference quantity, which range is a fixed number of quantity units, the method depicted in FIG. 5 is employed. If the time period T18–T13 is known for a given reference quantity, the time periods T14–T13 and T15–T14 can be determined. More particularly, the time period T14–T13 is related to one portion of the desired range on one side of the reference quantity as the time period T18–T13 is related to the reference quantity, and the time period T15–T14 is related to the other portion of the desired range on the other side of the reference quantity as the time period T18–T13 is related to the reference quantity. If the method depicted in FIG. 5 is implemented in hardware, the time period T18–T13 is calibrated with a reference signal, such that the time periods T14—T13 and T15—T14 can be readily determined. More particularly, if it is assumed that the time period T18—T13 is equal to 4000 time units when a reference quantity of 100 quantity units is integrated and discharged according to the method depicted in FIG. 5, then the time periods T15—T14 and T14—T13 will be equal to the product of 40 time units and the desired number of quantity units in each respective portion of the acceptable range of the unknown quantity.

From the above description of the dual slope integrator 10, it can be appreciated that the integrations and discharges of the resultant integrated levels depicted in FIGS. 2–5 can be achieved by the integrator 10 when an appropriate switching signal is supplied on the line 14 and the reference signal quantity and unknown signal quantity are supplied at appropriate times to the input 12 thereof. The integration time periods illustrated in FIGS. 2–5 and the discharge time periods T14—T13 and T15—T14 in FIG. 5 are determined by a circuit which is contained within the dotted line outline designated with the reference numeral 224 in FIG. 1. The circuit 224 also counts those discharge times depicted in FIGS. 2–5 which will be compared with one another. A logic circuit 226 controls the operation of the apparatus illustrated in FIG. 1 and an output circuit 228 provides an indication of the determination which is made. It is to be understood that all of the switches illustrated in FIG. 1 represent analog gates or switching circuits.

The line 24 is connected through an inverter 26 to supply a signal on a line 28 for controlling a switch 30. At the trailing edge of the zero crossing pulse, on the line 24, the switch 30 is closed and at the leading edge thereof, the switch 30 is opened. A digital clock 32 is connected through the switch 30 and through a switch 34 to either the input of a counter 36 or the input of a counter 38. Accordingly, during the integration portion of each cycle the clock 32 will be connected to one of the counters 36 and 38 and during the discharge portion of each cycle the clock 32 will be connected to the other of the counters 36 and 38 depending upon the position of the switch 34.

When the counter 38 has achieved a full count therein, an overflow bit pulse will be supplied to a latch 40 to generate the switching signal on the line 14. Accordingly, when the counter 38 has achieved a full count therein, the integrator 10 will be altered from its integration mode of operation to its discharge mode of operation. When the latch 40 has been reset, as will be described in greater detail below, the integrator 10 will be altered from its discharge mode of operation to its integration mode of operation.

The output of the latch 40 is also connected to a logic circuit 42 which is an EXCLUSIVE OR gate. A second input to the logic circuit 42 is supplied from a switch 44 which may be connected either to a positive source of voltage or to ground potential. An output of the logic circuit 42 controls the switch 34. When the switch 44 is connected to the positive source of voltage, the apparatus is in the percent-of-reading mode of operation. During the integration mode, as determined by the state of the signal on the line 14, with the switch 44 in the percent-of-reading position, the switch 34 will be in its illustrated position connecting the output of the clock 32 to the input of the counter 36. If the signal on the line 14 changes states, however, when the switch 44 is in the percent-of-reading position, the switch 34 is actuated to connect the output of the clock 32 to the counter 38. When the switch 44 is connected to ground potential, the apparatus is in the percent-of-full scale mode of operation. During the integration mode, as determined by the state of the signal on the line 14, with the switch 44 in the percent-of-full scale position, the switch 34 is actuated to connect the output of the clock 32 to the counter 38. If the signal on the line 14 changes states, however, when the switch 44 is in the percent-of-full scale position, the switch 34 is returned to its normal position to connect the output of the clock 32 to the counter 36.

An output of the counter 36 is connected to a decoder 46 having selectible outputs thereof connected to a plurality of latches 48, 50 and 52. Accordingly, when a particular count corresponding to a selected output of the decoder 46 has been achieved in the counter 36, a corresponding one of the latches 48, 50 and 52 will be set. Outputs of the latches 48, 50 and 52 are supplied to AND gates 54, 56 and 58, respectively, each having their other input connected to the clock 32 when the switch 30 is closed and the switch 34 is in the position illustrated in the drawing. Accordingly, when one of the AND gates 54, 56 and 58 is enabled by an appropriate latched output of the decoder 46, clock pulses will appear at its output. Accordingly, the number of clock pulses which are provided at the outputs of the AND gates 54, 56 and 58 will be less than the number of clock pulses supplied to the counter 36 by an increment determined by the particular output of the decoder 46 which is selected for connection to a respective one of the latches 48, 50 and 52. It is to be understood that the increment which is determined by any selected output of the decoder 46 may be equal to zero, such that the number of clock pulses at the output of the corresponding AND gate will be equal to the number of clock pulses supplied to the counter 36.

Switches 60 and 62, which are ganged together, connect the outputs of the AND gates 54 and 56, respectively, to the input of the counter 38 through a switch 64. A switch 66 which is ganged to the switch 64 connects the output of the AND gate 58 to the input of the counter 38. It can be appreciated from the drawing that one and only one of the AND gates 54, 56 and 58 is connected to the counter 38 at all times regardless of the positions of the switches 60, 62, 64 and 66. Accordingly, the counter 38 will be supplied with clock pulses either directly or from one and only one of the AND gates 54, 56 and 58 whenever the switch 30 is closed.

It can be appreciated that a closed loop has been described in which a voltage applied to the terminal 12 of the integrator 10 will be integrated for a first predetermined time period and then discharged for a second time period, with a count being stored in the counter 38 at the end of that second time period. More particularly, when a voltage is supplied to the terminal 12, the capacitor 16 will begin to charge and the switch 30 will be closed in response to the signal on the line 28. Clock pulses will be supplied to the counter 38 either directly or through one of the AND gates 54, 56 and 58. When a full count is contained in the counter 38, the state of the signal on the line 14 will change to open the switch 18 and close the switch 20. Also, this change of state at the output of the latch 40 will cause the switch 34 to be actuated. The next clock pulse will automatically reset the counter 38 and thereafter the counter 38 will count pulses supplied thereto from the clock 32 either directly or from one of the AND gates 54, 56 and 58 until the switch 30 is actuated by a change of the state of the signal on the line 28 corresponding to a zero crossing. At the end of such a cycle, therefore, the counter 38 will contain a count corresponding to at least a portion of a discharge time of the capacitor 16.

In the percent-of-reading mode, each integration time period will be equal to the time corresponding to a full count in the counter 38 plus the time corresponding to the selected output of the decoder 46. Accordingly, in the percent-of-reading mode, the counter 38 will contain a count at the end of each cycle which is equal to the total discharge time of the capacitor 16. In the percent-of-full scale mode, however, the integration time will be equal to the time corresponding to a full count in the counter 38. Also, in this mode, the counter 38 will contain a count at the end of each cycle which is equal to the discharge time of the capacitor 16 less the time corresponding to the selected output of the decoder 46.

The count contained in the counter 38 is transferred to a storage unit 68 whenever the serially connected switches 70 and 72 are closed. Outputs of the counter 38 and the storage unit 68 are connected to respective inputs of a high/low comparator 74. Accordingly, if a count is stored in the counter 38 during a first cycle of operation and then transferred to the storage unit 68, a subsequent count stored in the counter 38 can be compared with the transferred count in the comparator 74. If, for example, a count is stored during a first cycle of operation in the counter 38 corresponding to a reference quantity and then transferred to the storage unit 68, a subsequent count corresponding to an unknown quantity and contained in the counter 38 can be compared with the count corresponding to the reference quantity.

With the above description in mind, the apparatus will be described first in its percent-of-reading mode before further consideration of the percent-of-full scale mode of operation. Initially, therefore, the switches 44 and 34 are in their illustrated positions. A voltage corresponding to a reference quantity applied between terminals 82 and 84 is connected to the input of the integrator 10 when a switch 86 is closed. The switch 86 is ganged to a switch 88 and to the switches 64, 66 and 70. A voltage corresponding to an unknown quantity applied between terminals 90 and 84 is connected to the input of the integrator 10 when the switch 88 is closed. The switches 86, 88, 64, 66 and 70 may be controlled manually or by a signal from an external device.

With these switches in their illustrated positions, the voltage corresponding to the reference quantity will be integrated until the switch 18 is open. At the initiation of the positive portion of the integration of the reference voltage, the switch 30 will be closed to supply clock pulses to the input of the counter 36. With the switch 64 open and the switch 66 closed, clock pulses will not be supplied to the counter 38 until the AND gate 58 is enabled.

If the integration of the reference quantity corresponds to the line 202 in FIG. 2, then the output of the decoder 46 which is connected to the latch 52 will be high when the counter 36 has counted a number of pulses corresponding to the time period T2 − T1. Accordingly, when the latch 52 has been set, the AND gate 58 will be enabled to supply clock pulses to the input of the counter 38. A full count in the counter 38 corresponds to the time period T1. Accordingly, at time T2 the latch 40 will be set to open the switch 18, close the switch 20, and alter the position of the switch 34 to supply clock pulses directly to the counter 38.

When the switch 20 closes, the capacitor 16 discharges through the constant current source 22 at a fixed discharge rate. At the zero crossing of the discharge slope, the switch 30 will be opened and the counter 38 will contain a count corresponding to the time T8 − T2. At the end of that cycle, the switch 72 is closed and the count contained in the counter 38 is transferred to the storage unit 68. It can be appreciated that a plurality of the above described cycles can be repeated as often as desired without altering the count in the storage unit 68. Of course, this is the case only if the reference voltage is a well regulated and constant voltage.

Once the count corresponding to the reference quantity has been stored in the storage unit 68, the switch 86 can be opened and the switch 88 closed to connect the voltage corresponding to the unknown quantity to the input of the integrator 10. However, before discussing the operation of the apparatus with the unknown quantity supplied thereto, a description of certain control functions will be needed for a better understanding of that operation.

The pulse developed on the line 24 corresponding to a negative charge on the capacitor 16 enables an AND gate 92 to supply clock pulses to the input of a counter 94. The counter 94 is reset by the signal at the output of the inverter 26. Accordingly, the counter 94 begins counting clock pulses at the leading edge of the pulse on the line 24 and is reset at the trailing edge thereof. The output of the counter 94 is supplied to a decoder 96 and the outputs of the decoder 96 perform control functions.

The first clock pulse received by the counter 94 produces a pulse on an output line 98 which closes the switch 72 for the duration of that pulse. Output pulses are also produced on lines 100 and 102 and supplied to the output circuit 228 when the second and third clock pulses, respectively, are received by the counter 94. The fourth clock pulse received by the counter 94 produces a pulse on an output line 104 which is connected to the reset inputs of the counters 36 and 38 and the latches 40, 48, 50 and 52. The line 104 is also connected to a flip flop 106 which acts as a one stage counter. Accordingly, at the end of a first cycle of operation, the output of the flip flop 106 will be high and at the end of the next cycle the output of the flip flop 106 will be low. The output of the flip flop 106 is connected to the switches 60 and 62, such that they are actuated at the end of each cycle and held in their actuated position until the end of the next cycle.

Since the latch 40 is reset at the end of each cycle, the switches 18, 20 and 34 will be in their illustrated positions when the voltage corresponding to the unknown quantity is being integrated. When it is desired to begin the integration of the unknown quantity, switch 88 is closed, thereby opening switches 86, 66 and 70 and closing switch 64. At the zero crossing of the integration of the unknown quantity, the switch 30 will be closed to connect the clock 32 to the counter 36. With the switch 66 open and the switch 64 closed, clock pulses will be supplied to the counter 38 during every other cycle from the AND gate 54 and during the other alternate cycles from the AND gate 56 due to the actuation of the switches 60 and 62 at the end of each cycle. An output of the decoder 46 corresponding to a zero count in the counter 36 sets the latch 48 to enable the AND gate 54. Accordingly, during the cycle in which the switch 60 is closed, the latch 40 will be set at time T1.

The output of the decoder 46 which is connected to the latch 50 is high when the counter 36 contains a count corresponding to the time period T3 − T1. When the latch 50 is set, the AND gate 56 is enabled and, during the cycle when the switch 62 is closed, the latch 40 will be set at time T3. Accordingly, it can be appreciated that the integration time of the unknown quantity alternates between the time period T1 and the time period T3 in alternate, successive cycles.

In each of those cycles, when the latch 40 has been set by a full count in the counter 38, the switch 34 is actuated to connect clock pulses directly to the input of the counter 38. Accordingly, the counter 38 will accumulate a count therein corresponding to the respective discharge times of the integrated unknown quantity. Since the switch 70 is open this count is not transferred to the storage unit 68, but is retained in the counter 38 for comparison in the comparator 74 with the count corresponding to the reference quantity in storage unit 68.

If the count contained in the storage unit 68 is greater than the count contained in the counter 38, a high output will be provided on an output line 108 thereof. If the count contained in the storage unit 68 is less than the count contained in the counter 38, a high output will be provided on an output line 110 of the comparator 74. If the unknown quantity is within the desired range, and the switch 62 is closed to integrate the unknown quantity for time T3, the count contained in the counter 38 will be greater than the count contained in the storage unit 68. Accordingly, under such conditions a high output will be provided on the line 110 and the low output on the line 108.

When the unknown quantity is within the desired range and the switch 60 is closed, it will be integrated for a time T1 and the counter 38 will contain a count which is less then the count contained in the storage unit 68. Under such conditions, a high output will be provided on the output line 108 and a low output on the line 110. Lines 108 and 110 are connected through switches 112 and 114, respectively, to a latch 116. The switches 112 and 114 are controlled by an output of the flip flop 106 which controls the switches 60 and 62. Accordingly, the switches 112 and 114 will be actuated at the same time that the switches 60 and 62 are actuated.

Under the above described conditions, when the unknown quantity is within the desired range, the output lines 108 and 110 will not be connected through the switches 112 and 114 whenever a high signal appears on each. That is, when a high output appears on the line 110, the switches 112 and 114 will be in their illustrated positions and when a high output appears on the line 108, the switches 112 and 114 will be actuated to their opposite positions. Accordingly, the latch 116 will not be set under such conditions. The state of each of the outputs on the lines 108 and 110 is periodically sampled by a switch 118 which is actuated in response to a pulse on the line 100 occurring during the second clock pulse supplied to the counter 94 at the end of each cycle.

If the unknown quantity is outside the desired range, one of the outputs on the lines 108 and 110 will be high when switch 118 is actuated regardless of the positions of the switches 60 and 62. If, for example, the unknown quantity is greater than the upper limit of the desired and established range, the count contained in the counter 38 will always be greater than the count contained in the storage unit 68 when switch 118 is actuated. Under such conditions, the output on the line 110 will remain high and when the switches 114 and 118 are actuated, a pulse will be supplied to the latch 116 to set it. If, for example, the unknown quantity is less than the lower limit of the desired range, the count contained in the counter 38 will always be less than the count contained in the storage unit 68 when switch 118 is actuated. Under such conditions, a high output will exist on the output line 108 during successive cycles when switch 118 is actuated. When the switch 112 is in its illustrated position and the switch 118 is closed, such a high output will set the latch 116. The latch 116 is reset by a pulse on the line 104 which occurs at the end of each cycle.

Accordingly, when the unknown quantity is outside the desired range, the latch 116 will be set during every other cycle and reset during the other alternate cycles. The output of the latch 116 is connected to the input of a flip flop 120 having its output connected to the input of a flip flop 122. The flip flops 120 and 122 are enabled by a pulse appearing on the lines 102. Accordingly, when the unknown quantity is within the desired range, the flip flops 120 and 122 will not be set. However, if the unknown quantity is outside the desired range, one of the flip flops 120 and 122 will be set at all times and the other will be reset at all times. The outputs of the flip flops 120 and 122 are connected to respective inputs of an OR gate 124 having its output connected through a lamp 126 and through an inverter 128 and lamp 130 to ground potential. Accordingly, if either one of the flip flops 120 or 122 is set, the lamp 126 will be illuminated, otherwise the lamp 130 will be illuminated. Illumination of the lamp 126, therefore, indicates that the unknown quantity is outside the desired range, whereas illumination of the lamp 130 indicates that the unknown quantity is within the desired range.

In the description of FIG. 2 it was stated that any one of the lines 200, 202 or 204 could represent the integration of the reference quantity; that either one of the lines 200 or 202 could represent the integration of the upper limit of the desired range; and that either one of the lines 202 or 204 could represent the integration of the lower limit of the desired range. Such selection of the desired range with respect to the reference quantity is performed by selecting an appropriate output of the decoder 46 for connection to a respective one of the latches 48, 50 and 52. If, for example, the line 200 represents the integration of the reference quantity, then the output of the decoder 46 which is selected for connection to the latch 52 will be high when a zero count is contained in the counter 36. If the integration of the upper limit of the desired range also corresponds to the line 200, then the same output of the decoder 46 is selected for connection to the latch 48 which is high whenever a zero count is contained in the counter 36. However, if the integration of the upper limit of the desired range corresponds to the line 202, then the output of the decoder 46 which is selected for connection to the latch 48 is high whenever a count is contained in the counter 36 which corresponds to the time period T2−T1. It can be appreciated, therefore, that any output of the decoder 46 can be selected for connection to the latches 48, 50 and 52, as long as the output which is connected to the latch 50 corresponds to a count in the counter 36 which is not less than that count contained in the counter 36 which produces a high level signal at the output of the decoder 46 which is selected for connection to the latch 48.

Under any of the above described conditions and operating parameters, the comparator 74 and output circuit 228 will provide an indication of whether the unknown quantity is within the desired range. That is, if the line 200 represents the integration of the reference quantity and lines 202 and 204 represent the integration of the upper limit and lower limit, respectively, of the desired range, then the lamp 130 will be illuminated whenever the unknown quantity is within the desired range. It can be appreciated from FIG. 2 that when the integration of the unknown quantity has a slope which is less than the slope of the line 202 and greater than the slope of the line 204, its resultant integrated level at time T2 will be less than X5 and its resultant integrated level at time T3 will be greater than X5. Accordingly, the discharge time periods beginning at time T2 and at time T3 will be less than and greater than time period T7–T1, respectively.

In the above described operational sequence, it was stated that the reference quantity was supplied in the form of a voltage across the terminals 82 and 84 and integrated by the integrator 10, such that a count corresponding to the discharge time thereof was transferred from the counter 38 to the storage unit 68. However, it may be desirable under certain circumstances to eliminate that cycle of the operation if the reference quantity is known. Under such conditions, a count corresponding to the discharge time of a known reference quantity can be preset into the storage unit 68 from a preset circuit 132 which can be manually programmed.

If it is desirable to provide a range which is a percentage of full scale, the switch 44 is actuated from its illustrated position. During the percent-of-full scale mode of operation, the switch 34 is actuated from its illustrated position to supply clock pulses directly to the input of the counter 38 at the initiation of each cycle of operation. Accordingly, the integration of the reference quantity and of the unknown quantity will occur over the same time period, T13 in FIG. 5. Accordingly, the time period T13 corresponds to a full count in the counter 38. When that full count has been achieved in the counter 38, the latch 40 is set to open the switch 18 and close the switch 20 and to actuate the switch 34 to its illustrated position. Outputs of the decoder 46 which are selected for connection to the latches 50 and 52 are high whenever a count is contained in the counter 36 corresponding to the time periods T15–T13 and T14–T13, respectively. The output of the decoder 46 which is connected to the latch 48 is high whenever a zero count is contained in the counter 36. Of course, these outputs are selected only when the integration of the reference quantity corresponds to the line 216 and the integration of the upper limit and lower limit of the desired range correspond to the lines 218 and 220, respectively. It can be appreciated, however, that the integration of the reference quantity may correspond to any one of the lines 216, 218 or 220; that the integration of the upper limit of the desired range may correspond to either one of the lines 216 or 218; and that the integration of the lower limit of the desired range may correspond to either one of the lines 216 or 220. The selection of the desired range with respect to the reference quantity is performed by selecting the appropriate output of the decoder 46 for connection to a respective one of the latches 48, 50 and 52.

During the percent-of-full scale mode of operation, therefore, an increment of time is subtracted from the discharge time of each of the integrated levels which are achieved and the remaining time is temporarily stored in the counter 38. The count corresponding to the discharge time of the reference quantity which is contained in the counter 38 is transferred to the storage unit 68 when both of the switches 70 and 72 are closed under the conditions described above.

In the percent-of-reading mode of operation, when the unknown quantity is integrated for the shortest of its two integration time periods and when it is within the desired range, its discharge time period will always be less than the discharge time period of the reference quantity. However, in the percent-of-full scale mode of operation, when the resultant integrated level at time T13 corresponding to the unknown quantity is discharged and the shortest increment of time is subtracted from that discharge time, the remaining discharge time corresponding thereto will always be greater than the discharge time corresponding to the reference quantity if the unknown quantity is within the desired range. Accordingly, valid results can only be achieved at the output of the comparator circuit 74 if its outputs are sampled in the opposite order of that required in the percent-of-reading mode of operation.

This is accomplished by a pair of switches 134 and 136 which are ganged to the switch 44 and are connected in series with output lines 108 and 110 to switches 112 and 114, respectively. Accordingly, when the switch 62 is closed, the output line 110 of the comparator 74 will be connected through the switch 114 to the latch 116, and when the switch 60 is closed, the output line 108 of the comparator 74 will be connected through switch 112 to the latch 116. Accordingly, it can be appreciated from the description of the output circuit given above with respect to the percent-of-reading mode of operation that the lamp 130 will be illuminated whenever the unknown quantity is within the desired range and that the lamp 126 will be illuminated whenever the unknown quantity is outside the desired range in the percent-of-full scale mode of operation. Again, it is not necessary to perform that cycle of the operation for integrating and discharging the reference quantity if it is known, since a count corresponding to its discharge time can be preset into the storage unit 68 from the preset circuit 132.

The invention claimed is:
1. A method of determining when an unknown electrical signal quantity is within a desired range of a reference electrical signal quantity, comprising the steps of:
   a. obtaining a first measurement time proportional to the value of said reference quantity,
   b. integrating said unknown quantity for a first preselected integration time period to obtain a first integrated level,
   c. discharging from said first integrated level to a first discharge level at a fixed discharge rate for a first preselected discharge time period,
   d. further discharging from said first discharge level at said fixed discharge rate to a preselected level, e. measuring a second measurement time required to discharge from said first discharge level at said fixed rate to said preselected level,
f. integrating said unknown quantity for a second preselected integration time period to obtain a second integrated level,
g. discharging from said second integrated level to a second discharge level at said fixed discharge rate for a second preselected discharge time period, one of said first preselected time periods and one of said second preselected time periods being selected such that when the value of each of the limits of said desired range is integrated for a respective one of said first and second preselected integration time periods and discharged for a respective one of said first and second preselected discharge time periods the resultant discharge levels will be equal to one another,
h. further discharging from said second discharge level at said fixed discharge rate to said preselected level,
i. measuring a third measurement time required to discharge from said second discharge level at said fixed rate to said preselected level, and
j. comparing said measurement times with one another, such that when the first measurement time is between the second and third measurement times, the value of the unknown quantity is within said desired range.

2. The method of claim 1, wherein said first measurement time is obtained by the steps of integrating said reference quantity for a third preselected integration time period to obtain a third integrated level, discharging from said third integrated level to a third discharge level at said fixed discharge rate for a third preselected discharge time period, further discharging from said third discharge level at said fixed discharge rate to said preselected level, and measuring said first measurement time as the time required to discharge from said third discharge level at said fixed rate to said preselected level, one of said third preselected time periods being selected such that when the value of each of the limits of said desired range is integrated for a respective one of said first and second preselected integration time periods and discharged for a respective one of said first and second preselected discharge time periods and the value of said reference quantity is integrated for said third preselected integration time period and discharged for said third preselected discharge time period, the resultant discharge levels will be equal to one another.

3. The method of claim 2, wherein said first, second and third preselected discharge time periods are equal to zero; and wherein said first, second and third discharge levels are equal to said first, second and third integrated levels, respectively.

4. The method of claim 3, wherein said first, second and third preselected integration time periods are selected such that when the value of each of the limits of said desired range is integrated for a respective one of said first and second integration time periods and the value of said reference quantity is integrated for said third integration time period, the resultant integrated levels will be equal to one another.

5. The method of claim 1, wherein said first and said second preselected discharge time periods are equal to zero, wherein said first discharge level is equal to said first integrated level and said second discharge level is equal to said second integrated level, and wherein said first and second integration time periods are selected such that when the value of each of the limits of said desired range is integrated for a respective one of said first and second integration time periods, the resultant integrated levels will be equal to one another.

6. The method of claim 1, wherein said first preselected integration time period is equal to said second preselected integration time period, and wherein said first and second discharge time periods are selected such that when the value of each of the limits of said desired range is integrated for said first integration time period and discharged from the resultant integrated levels for a respective one of said first and second discharge time periods, the resultant discharge levels will be equal to one another.

7. The method of claim 6, wherein said first measurement time is obtained by the steps of integrating said reference quantity for said first preselected integration time period to obtain a third integrated level, discharging from said third integrated level to a third discharge level at said fixed discharge rate for a third preselected discharge time period, further discharging from said third discharge level to said preselected level at said fixed discharge rate, and measuring said first measurement time as the time required to discharge from said third discharge level at said fixed rate to said preselected level, and wherein said first, second and third discharge time periods are selected such that when the value of each of the limits of said desired range is integrated for said first integration time period and the resultant integrated levels are each discharged for a respective one of said first and second discharge time periods and the values of said reference quantity is integrated for said first integration time period and the resultant integrated level is discharged for said third discharge time period, the resultant discharge levels will be equal to one another.

8. A method of determining when an unknown electrical signal quantity is within a desired range of a reference electrical signal quantity, comprising the steps of:
a. obtaining a first measurement time proportional to the value of said reference quantity,
b. integrating said unknown quantity for a preselected first time period to obtain a first integrated level,
c. discharging from said first integrated level at said fixed discharge rate to a preselected level,
d. measuring a second measurement time required to discharge from said first integrated level at said fixed rate to said preselected level,
e. integrating said unknown quantity for a preselected second time period to obtain a second integrated level, said first and second preselected time periods being selected such that when the value of each of the limits of said desired range is integrated for said first and second preselected time periods, respectively, the resultant integrated levels will be equal to one another,
f. discharging from said second integrated level at said fixed discharge rate to said preselected level,
g. measuring a third measurement time required to discharge from said second integrated level at said fixed rate to said preselected level, and
h. comparing said measurement times with one another such that when the first measurement time is between the second and third measurement times, the value of the unknown quantity is within said desired range.

9. The method of claim 8, wherein said first measurement time is obtained by the steps of integrating said reference quantity for a preselected third time period to obtain a third integrated level, discharging from said third integrated level at said fixed discharge rate to a preselected level, and measuring said first measurement time as the time required to discharge from said third integrated level at said fixed rate to said preselected level, and wherein said third preselected time period is selected such that when the value of each of the limits of said desired range is integrated for said first and second time periods, respectively the resultant integrated levels will be equal to said third integrated level.

10. A method of determining when an unknown electrical signal quantity is within a desired range of a reference electrical signal quantity, comprising the steps of:
   a. obtaining a first measurement time proportional to the value of said reference quantity,
   b. integrating said unknown quantity for a first preselected integration time period to obtain a first integrated level,
   discharging from said first integrated level to a first discharge level at a fixed discharge rate for a first preselected discharge time period, said first preselected discharge time period being selected such that when the values of the upper and lower limits of said desired range are integrated for said first integration time period and the resultant integrated level corresponding to said upper limit is discharged for said first preselected discharge time period, the resultant discharge level will be equal to the resultant integrated level corresponding to said lower limit,
   d. further discharging from said first discharge level at said fixed discharge rate to a preselected level,
   e. measuring a second measurement time required to discharge from said first discharge level at said fixed rate to said preselected level,
   f. again integrating said unknown quantity for said first preselected integration time period to obtain said first integrated level,
   g. discharging from said first integrated level at said fixed discharge rate to said preselected level,
   h. measuring a third measurement time required to discharge from said first integrated level at said fixed rate to said preselected level, and
   i. comparing said measurement times with one another, such that when the first measurement time is between the second and third measurement times, the value of the unknown quantity is within said desired range.

11. The method of claim 10, wherein said first measurement time is obtained by the steps of integrating said reference quantity for said first preselected integration time period to obtain a second integrated level, discharging from said second integrated level to a second discharge level at a fixed discharge rate for a second preselected discharge time, said second preselected discharge time being selected such that when the value of said reference quantity is integrated for said first integration time period and the resultant integrated level is discharged for said second preselected discharge time, the resultant discharge level will be equal to the resultant integrated level corresponding to said lower limit, further discharging from said second discharge level at said fixed discharge rate to said preselected level, and measuring said first measurement time as the time required to discharge from said second discharge level at said fixed rate to said preselected level.

12. A method of determining when an unknown electrical signal quantity is within a desired range of a reference electrical signal quantity, comprising the steps of:
   a. obtaining a first measurement time proportional to the value of said reference quantity,
   b. integrating said unknown quantity for a first preselected integration time period to obtain a first integrated level,
   c. discharging from said first integrated level to a first discharge level at a fixed discharge rate for a first preselected discharge time period,
   d. further discharging from said first discharge level at said fixed discharge rate to a preselected level,
   e. measuring a second measurement time required to discharge from said first discharge level at said fixed rate to said preselected level,
   f. again integrating said unknown quantity for said first preselected integration time period to obtain said first integrated level,
   g. discharging from said first integrated level to a second discharge level at said fixed discharge rate for a second preselected discharge time period, said first and second preselected discharge time periods being selected such that when the values of the upper and lower limits of said desired range are integrated for said first integration time period and the resultant integrated levels are discharged for said first preselected discharge time period and said second preselected discharge time period, respectively, the resultant discharge levels will be equal to one another,
   h. measuring a third measurement time required to discharge from said second discharge level at said fixed rate to said preselected level, and
   i. comparing said measurement times with one another, such that when the first measurement time is between the second and third measurement times, the value of the unknown quantity is within said desired range.

13. The method of claim 12, wherein said first measurement time is obtained by the steps of integrating said reference quantity for said first preselected integration time period to obtain a second integrated level, discharging from said second integrated level to a third discharge level at said fixed rate for a third preselected discharge time period, said third preselected discharge time period being selected such that when the values of the upper and lower limits of said desired range and of the reference quantity are integrated for said first integration time period and the resultant integrated levels corresponding thereto are discharged for said first, second and third preselected discharge time periods, respectively, the resultant discharge levels will be equal to one another, further discharging from said third discharge level at said fixed discharge rate to said preselected level, and measuring said first measurement time as the time required to discharge from said third discharge level at said fixed rate to said preselected level.

14. The method of claim 13, wherein one of said preselected discharge time periods is equal to zero.

15. A method of determining when an unknown electrical signal quantity is outside at least one limit of a desired range of a reference electrical signal quantity, comprising the steps of:
a. obtaining a first measurement time equal to the time required to discharge at a fixed discharge rate from a first discharge level to a preselected level, said first discharge level being equal to a level obtained if said reference quantity is integrated for a first preselected integration time period to obtain a first integrated level and said first integrated level is discharged at said fixed discharge rate for a first preselected discharge time period;
b. integrating said unknown quantity for said first preselected integration time period to obtain a second integrated level;
c. discharging from said second integrated level to a second discharge level at said fixed discharge rate for a second preselected discharge time period, said second discharge time period being selected such that if said one limit of said range is integrated for said first integration time period and the resultant integrated level is discharged at said fixed discharge rate for said second discharge time period, the resultant discharge level will be equal to said first discharge level;
d. further discharging from said second discharge level at said fixed discharge rate to said preselected level;
e. measuring a second measurement time required to discharge from said second discharge level at said fixed rate to said preselected level; and
f. comparing said measurement times with one another, such that when said second measurement time is greater than said first measurement time, said unknown quantity is greater than said one limit, and when said second measurement time is less than said first measurement time, said unknown quantity is less than said one limit.

16. The method of claim 15, wherein one of said discharge time periods is equal to zero.

17. A method of determining when an unknown electrical signal quantity is outside at least one limit of a desired range of a reference electrical signal quantity, comprising the steps of:
a. obtaining a first measurement time equal to the time required to discharge at a fixed discharge rate from a first integrated level to a preselected level, said first integrated level being equal to a level obtained if said reference quantity is integrated for a first preselected integration time period;
b. integrating said unknown quantity for a second preselected integration time period to obtain a second integrated level, said second integration time period being selected such that if said one limit of said range is integrated for said second integration time period, the resultant integrated level will be equal to said first integrated level;
c. discharging from said second integrated level to said preselected level at said fixed discharge rate;
d. measuring a second measurement time required to discharge from said second integrated level to said preselected level at said fixed discharge rate; and
e. comparing said measurement times with one another, such that when said second measurement time is greater than said first measurement time, said unknown quantity is greater than said one limit, and when said second measurement time is less than said first measurement time, said unknown quantity is less than said one limit.

18. An apparatus for determining when an unknown electrical signal quantity is within a desired range of a reference electrical signal quantity, comprising:
a. means having a plurality of successive cycles, each cycle having an integration mode for integrating an analog signal supplied to its input for an integration time period and a discharge mode for discharging a resultant integrated level therein to a preselected level during a discharge time period;
b. means for altering one of said time periods in each of said cycles by a respective one of a plurality of incremental time periods to obtain respective resultant time periods, said one time period being related to the difference between two of said incremental time periods as one of the limits of said desired range is related to said desired range; said integrating and discharging means including means for measuring a resultant discharge time period in each cycle;
c. means for supplying said reference electrical signal quantity to said integrating and discharging means in a first cycle and said unknown electrical signal quantity to said integrating and discharging means in a second cycle; and
d. means connected to said measuring means for comparing the resultant discharge time periods in said first cycle with the resultant discharge time period in said second cycle.

19. The apparatus of claim 18, wherein one of said incremental time periods is equal to zero.

20. The apparatus of claim 18, wherein said one time period is said integration time period.

21. The apparatus of claim 18, wherein said one time period is said discharge time period.

22. The apparatus of claim 18, wherein said integrating and discharging means includes a dual slope integrator, a digital clock, and a first counter; and wherein said altering means includes a second counter, and a decoder connected to an output of said second counter; said integrating and discharging means further including means for connecting said clock to the input of one of said counters, and said altering means further including means responsive to at least one output of said decoder for connecting the input of said first counter to the output of said clock.

23. The apparatus of claim 22, further including means for connecting said clock directly to said first counter and disconnecting said clock from said second counter during said discharge mode.

24. The apparatus of claim 22, further comprising means for connecting said clock directly to said first counter and disconnecting said clock from said second counter during said integration mode.

25. The apparatus of claim 22, further comprising a storage unit and means for connecting said first counter to said storage unit during said first cycle.

26. The apparatus of claim 18, wherein said supplying means is further disposed for supplying said unknown electrical signal quantity to said integrating and discharging means in a third cycle; said altering means being further disposed for altering said one time period in said third cycle by a respective one of said incremental time periods, with the incremental time period in each of said first, second and third cycles being unequal; and said comparing means being further disposed for comparing the resultant discharge time periods in said first cycle with the resultant discharge time period in said third cycle.

* * * * *